(12) United States Patent
Chi et al.

(10) Patent No.: US 9,299,650 B1
(45) Date of Patent: Mar. 29, 2016

(54) INTEGRATED CIRCUIT PACKAGING SYSTEM WITH SINGLE METAL LAYER INTERPOSER AND METHOD OF MANUFACTURE THEREOF

(71) Applicants: HeeJo Chi, Yeoju-gun (KR); HanGil Shin, Seoul (KR); NamJu Cho, Uiwang-si (KR); Kyung Moon Kim, Seongnam (KR)

(72) Inventors: HeeJo Chi, Yeoju-gun (KR); HanGil Shin, Seoul (KR); NamJu Cho, Uiwang-si (KR); Kyung Moon Kim, Seongnam (KR)

(73) Assignee: STATS ChipPAC Ltd., Singapore (SG)

( * ) Notice: Subject to any disclaimer, the term of this patent is extended or adjusted under 35 U.S.C. 154(b) by 0 days.

(21) Appl. No.: 14/037,274

(22) Filed: Sep. 25, 2013

(51) Int. Cl.
*H01L 23/552* (2006.01)
*H01L 23/498* (2006.01)
*H01L 21/56* (2006.01)

(52) U.S. Cl.
CPC .......... *H01L 23/49816* (2013.01); *H01L 21/56* (2013.01)

(58) Field of Classification Search
CPC ...... H01L 23/3128; H01L 23/49541; H01L 23/49575; H01L 23/49816; H01L 25/105; H01L 25/03; H01L 23/13; H01L 23/3107; H01L 23/49833; H01L 24/16; H01L 24/29; H01L 24/32; H01L 24/48; H01L 25/0657; H01L 2224/13025; H01L 2224/16145; H01L 2224/32145
USPC ......... 257/738, 737, 778, 685, 686, 723, 777, 257/724, 666, E23.031, E21.502, E23.068, 257/E23.116, E21.599, E21/502, E23.101, 257/E23.114, 706, 659, 774, 773, E23.011
See application file for complete search history.

(56) References Cited

U.S. PATENT DOCUMENTS

| | | | |
|---|---|---|---|
| 5,973,393 A | 10/1999 | Chia et al. | |
| 6,489,676 B2 | 12/2002 | Taniguchi et al. | |
| 6,847,109 B2 | 1/2005 | Shim | |
| 7,901,987 B2 * | 3/2011 | Yang | H01L 25/105 257/686 |
| 8,076,765 B2 | 12/2011 | Chen et al. | |
| 8,106,495 B2 | 1/2012 | Kajiki | |
| 8,330,277 B2 * | 12/2012 | Machida | 257/773 |
| 8,338,233 B2 | 12/2012 | Camacho et al. | |
| 8,355,262 B2 * | 1/2013 | Inoue et al. | 361/761 |
| 8,421,203 B2 * | 4/2013 | Chi | H01L 23/3128 174/254 |
| 2007/0108583 A1 * | 5/2007 | Shim et al. | 257/686 |
| 2008/0308950 A1 * | 12/2008 | Yoo et al. | 257/778 |
| 2009/0146315 A1 * | 6/2009 | Shim et al. | 257/777 |
| 2011/0298119 A1 * | 12/2011 | Cho et al. | 257/686 |
| 2012/0153467 A1 * | 6/2012 | Chi et al. | 257/737 |
| 2012/0153505 A1 * | 6/2012 | Chi et al. | 257/777 |
| 2012/0168916 A1 * | 7/2012 | Chi et al. | 257/659 |
| 2012/0241925 A1 * | 9/2012 | Yoon et al. | 257/666 |
| 2012/0306102 A1 * | 12/2012 | Cho et al. | 257/777 |
| 2013/0075927 A1 * | 3/2013 | Chi et al. | 257/774 |
| 2013/0078915 A1 * | 3/2013 | Zhao | H01L 23/552 455/41.1 |
| 2013/0105970 A1 * | 5/2013 | Chi et al. | 257/737 |
| 2013/0334697 A1 * | 12/2013 | Shin et al. | 257/774 |
| 2015/0069637 A1 * | 3/2015 | Zhao et al. | 257/778 |

* cited by examiner

*Primary Examiner* — Alexander Oscar Williams
(74) *Attorney, Agent, or Firm* — Ishimaru & Associates LLP (57) ABSTRACT

An integrated circuit packaging system and method of manufacture thereof including: a base substrate; an integrated circuit die on the base substrate; vertical interconnects attached to the base substrate around the integrated circuit die; and a single metal layer interposer mounted on the vertical interconnects, the single metal layer interposer including: a routing pattern having interposer contacts and traces, and a dielectric layer on the interposer contacts and traces, a top surface of the interposer contacts coplanar with a top surface of the dielectric layer.

20 Claims, 10 Drawing Sheets

INTEGRATED CIRCUIT PACKAGING SYSTEM WITH SINGLE METAL LAYER INTERPOSER AND METHOD OF MANUFACTURE THEREOF

TECHNICAL FIELD

The present invention relates generally to an integrated circuit packaging system, and more particularly to a system with an interposer.

BACKGROUND ART

Semiconductor chips have become progressively more complex, driven in large part by the need for increasing processing power in a smaller chip size for compact or portable electronic devices such as cell phones, smart phones, personal media systems, ultraportable computers.

Stacking multiple chips in a single package can help meet the need for smaller package sizes. One method for increasing chip density is a package-on-package-mold embedded package (PoP-MeP) where a chip is embedded in molding compound and an interposer is placed on the molding compound and connected to a substrate under the molding compound. Another package is then connected to the interposer. However, the necessity of routability of inputs and outputs through the interposer can lead to greater cost of a laminate interposer or substrates.

Thus, a need still remains for a simpler and cheaper method of manufacturing interposer substrates. In view of the increasing demands placed on semiconductor chips, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a base substrate; mounting an integrated circuit die on the base substrate; attaching vertical interconnects to the base substrate around the integrated circuit die; forming a single metal layer interposer including: providing a leadframe having interposer contacts, applying a dielectric layer to the leadframe, and removing a portion of the leadframe for forming a routing pattern with the interposer contacts and traces, a top surface of the interposer contacts coplanar with a top surface of the dielectric layer; and mounting the single metal layer interposer on the vertical interconnects.

The present invention provides an integrated circuit packaging system, including: a base substrate; an integrated circuit die on the base substrate; vertical interconnects attached to the base substrate around the integrated circuit die; and a single metal layer interposer mounted on the vertical interconnects, the single metal layer including: a routing pattern having interposer contacts and traces, and a dielectric layer on the interposer contacts and traces, a top surface of the interposer contacts coplanar with a top surface of the dielectric layer.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure.

The term "processing" as used herein includes deposition of material or photoresist, patterning, exposure, development, etching, cleaning, and/or removal of the material or photoresist as required in forming a described structure.

Figure 1:
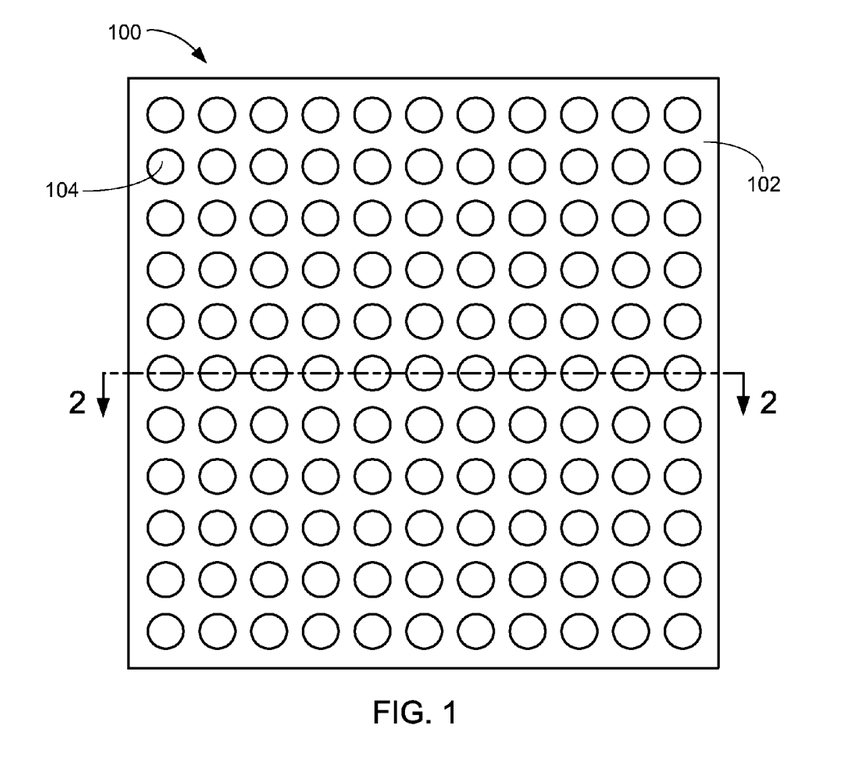
FIG. 1 is a bottom view of an integrated circuit packaging system in a first embodiment of the present invention.

Referring now to FIG. 1, therein is shown a bottom view of an integrated circuit packaging system 100 in a first embodiment of the present invention. The bottom view shows a base substrate 102 and external connectors 104.

The base substrate 102 is defined as a structure containing conductive traces and contacts. For example, the base substrate 102 can be a laminate material, a metallic material, a ceramic material, or a combination thereof. The base substrate 102 can have the external connectors 104 on contact pads for connection to other components or next level systems.

The external connectors 104, such as solder balls, can function to electrically connect components internal to the integrated circuit packaging system 100 to the outside. The external connectors 104 can be arranged in an array as shown or can be arranged in a staggered, regular, or irregular array, for example. The external connectors 104 can also provide a path to ground.

Figure 2:
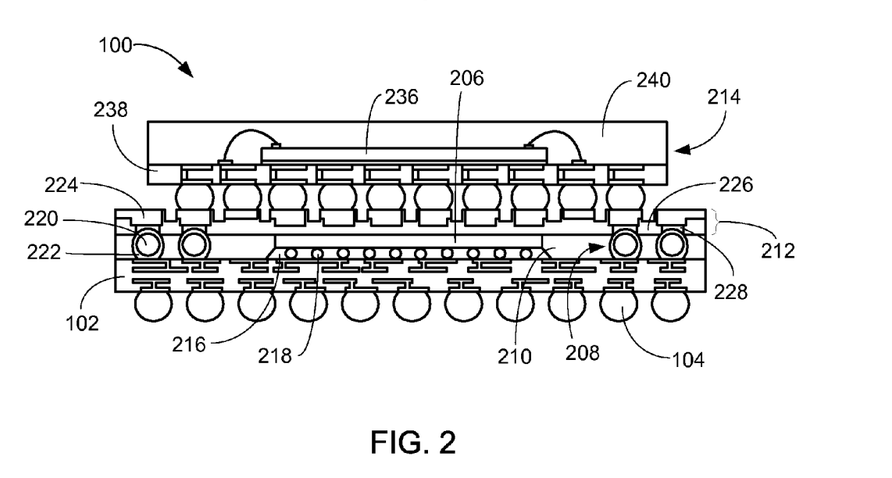
FIG. 2 is a cross-sectional view of the integrated circuit packaging system along the section line 2-2 of FIG. 1.

Referring now to FIG. 2, therein is shown a cross-sectional view of the integrated circuit packaging system 100 along the section line 2-2 of FIG. 1. The cross-sectional view shows an integrated circuit die 206, vertical interconnects 208, a package body 210, a single metal layer interposer 212, the base substrate 102, and a top package 214.

The integrated circuit die 206, such as a flip chip or a wire-bond die, can be mounted on the base substrate 102 opposite the external connectors 104. In this example, an underfill 216 is between the integrated circuit die 206 and the base substrate 102, and the underfill 216 surrounds internal interconnects 218 which connect the integrated circuit die 206 to the base substrate 102.

Surrounding the integrated circuit die 206 are the vertical interconnects 208, which are also on the base substrate 102. The vertical interconnects 208 can take various forms. In this example, the vertical interconnects 208 are made from a conductive core 220 covered in a solder layer 222. The top of the vertical interconnects 208 are exposed from the package body 210, which encapsulates the integrated circuit die 206 and the vertical interconnects 208. The package body 210 can be made from a material such as epoxy molding compound, curable underfill, or other moldable compound or encapsulation, for example.

The single metal layer interposer 212 is defined as a structure having only a single metal layer of contacts and traces held together by a dielectric. The single metal layer interposer 212 has interposer contacts 224 exposed on one side of a dielectric layer 226. A top surface of the interposer contacts 224 can be coplanar with a top surface of the dielectric layer 226 such that the interposer contacts 224 are embedded in but exposed from the dielectric layer 226. The interposer contacts 224 are arranged in an array which includes the center area of the single metal layer interposer 212 above the integrated circuit die 206. In this example, the interposer contacts 224 are isolated from each other by laser ablation, which leaves characteristic marks on the interposer contacts 224 and the dielectric layer 226 such as scorch marks, melted portions, and smooth side edges. The interposer contacts 224 are separated from each other by a gap that is only partially filled by the dielectric layer 226 due to the laser ablation process. Remnants of the dielectric layer 226 between the interposer contacts 224 can be seen at the edges of some of the interposer contacts 224, illustrating that it is unnecessary to make perfect cuts between the interposer contacts 224 as long as the interposer contacts 224 are electrically isolated from each other.

Some of the interposer contacts 224 can be connected to the opposite side of the dielectric layer 226 through conductive posts 228. The conductive posts 228 can be made from a conductive material such as solder, copper, or other plated or printed metal, for example. In this example, the conductive posts 228 are solder or solder paste deposited through holes in the dielectric layer 226 in direct contact with some of the interposer contacts 224.

The conductive posts 228 of the single metal layer interposer 212 are in direct contact with the vertical interconnects 208. This means that the top package 214, which is resting on the interposer contacts 224, can be connected to the external connectors 104 through the single metal layer interposer 212, the vertical interconnects 208, and the base substrate 102. The top package 214 is shown with a package integrated circuit die 236 mounted on a top package substrate 238 and covered by a top package encapsulation 240, but it is understood that the top package 214 can be in any configuration. For example, the top package 214 could contain multiple chips, passive devices, or even other packages. Also for example, another of the bottom package can be stacked on the single metal layer interposer 212.

It has been discovered that using the single metal layer interposer 212 in the integrated circuit packaging system 100 can reduce the overall package height and decrease manufacturing complexity and cost. The thickness of the single metal layer interposer 212 is lower than a standard laminated substrate with multiple layers, and is easier to manufacture.

It has also been discovered that the single metal layer interposer 212 can remain effective even with high levels of input-output (I/O) signal. The routing design of the single metal layer interposer 212 can be relaxed by distributing the routing traces and contacts necessary through the base substrate 102 and the top package 214.

Thus, it has been discovered that the integrated circuit packaging system 100 of the present invention furnishes important and heretofore unknown and unavailable solutions, capabilities, and functional aspects for manufacturing low-profile integrated circuit packages.

Figure 3:
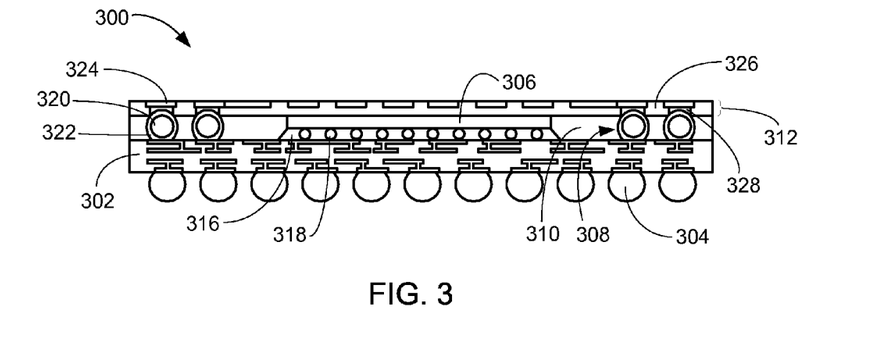
FIG. 3 is a cross-sectional view of the integrated circuit packaging system as exemplified by the top view of FIG. 1 and along the section line 2-2 of FIG. 1 in a second embodiment of the present invention.

Referring now to FIG. 3, therein is shown a cross-sectional view of the integrated circuit packaging system 300 as exemplified by the top view of FIG. 1 and along the section line 2-2 of FIG. 1 in a second embodiment of the present invention. The cross-sectional view shows an integrated circuit die 306, vertical interconnects 308, a package body 310, a single metal layer interposer 312, and a base substrate 302.

The base substrate 302 is defined as a structure containing conductive traces and contacts. For example, the base substrate 302 can be a laminate material, a metallic material, a ceramic material, or a combination thereof. The base substrate 302 can have external connectors 304 on contact pads for connection to other components or next level systems.

The external connectors 304, such as solder balls, can function to electrically connect components internal to the integrated circuit packaging system 300 to the outside. The external connectors 304 can be arranged in an array as shown or can be arranged in a staggered, regular, or irregular array, for example. The external connectors 304 can also provide a path to ground.

The integrated circuit die 306, such as a flip chip or a wire-bond die, can be mounted on the base substrate 302 opposite the external connectors 304. In this example, an underfill 316 is between the integrated circuit die 306 and the base substrate 302, and the underfill 316 surrounds internal interconnects 318 which connect the integrated circuit die 306 to the base substrate 302.

Surrounding the integrated circuit die 306 are the vertical interconnects 308 which are also on the base substrate 302. The vertical interconnects 308 can take various forms. In this example, the vertical interconnects 308 are made from a conductive core 320 covered in a solder layer 322. The top of the vertical interconnects 308 are exposed from the package body 310, which encapsulates the integrated circuit die 306 and the vertical interconnects 308. The package body 310 can be made from a material such as epoxy molding compound, curable underfill, or other moldable compound or encapsulation, for example.

The single metal layer interposer 312 is defined as a structure having only a single metal layer of contacts and traces held together by a dielectric. The single metal layer interposer 312 has interposer contacts 324 exposed on one side of a dielectric layer 326. A top surface of the interposer contacts 324 can be coplanar with a top surface of the dielectric layer 326 such that the interposer contacts 324 are embedded in but exposed from the dielectric layer 326. The interposer contacts 324 are arranged in an array which includes the center area of the single metal layer interposer 312 above the integrated circuit die 306. In this example, the interposer contacts 324 are isolated from each other by chemical etching, which leaves characteristic marks on the interposer contacts 324 and the dielectric layer 326 such as the interposer contacts 324 being slightly raised or recessed, excess material on the top surface of the dielectric layer 326, or an uneven or rough surface of the dielectric layer 326 due to damage from the etchant. The interposer contacts 324 are separated from each other by a gap filled by the dielectric layer 326.

Some of the interposer contacts 324 can be connected to the opposite side of the dielectric layer 326 through conductive posts 328. The conductive posts 328 can be made from a conductive material such as solder, copper, or other plated or printed metal, for example. In this example, the conductive posts 328 are solder or solder paste deposited through holes in the dielectric layer 326 in direct contact with some of the interposer contacts 324.

The conductive posts 328 of the single metal layer interposer 312 are in direct contact with the vertical interconnects 308. This means that other components or packages connected to the interposer contacts 324 can be connected to the external connectors 304 through the single metal layer interposer 312, the vertical interconnects 308, and the base substrate 302.

Figure 4:
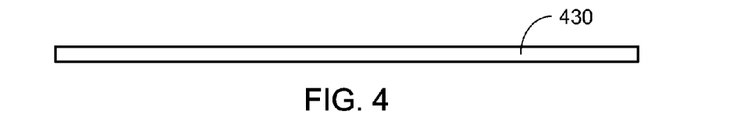
FIG. 4 is a cross-sectional view of a single metal layer sheet in a manufacturing step of the integrated circuit packaging system of FIG. 2.

Referring now to FIG. 4, therein is shown a cross-sectional view of a single metal layer sheet in a manufacturing step of the integrated circuit packaging system 100 of FIG. 2. The manufacturing process is described in relation to the embodiment shown in FIG. 2, but it is understood that the manufacturing process can be very similar for other embodiments to be described later. The cross-sectional view shows a single metal base layer 430 which can be a plate or foil, depending on the patterning process chosen for a later step. The single metal base layer 430 can be made from a metal or metal alloy such as copper, tin, or an alloy thereof. If the single metal base layer 430 is a foil, a supporting or sacrificial carrier (not shown) may be necessary for later processes.

Figure 5:
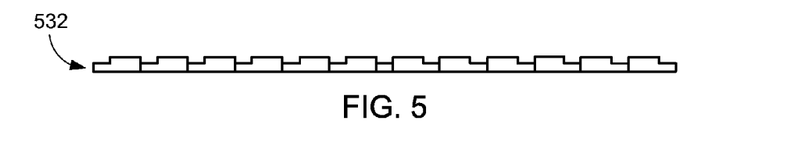
FIG. 5 is the structure of FIG. 4 in a metal patterning phase of manufacture.

Referring now to FIG. 5, therein is shown the structure of FIG. 4 in a metal patterning phase of manufacture. The single metal base layer 430 of FIG. 4 is patterned in this step to form a leadframe 532 in different ways depending on whether the single metal base layer 430 was a plate or foil (starting with a thicker base layer or a thinner base layer). If the single metal base layer 430 was a plate, it can be patterned through masking and chemical etching to remove excess material. If the single metal base layer 430 was a foil, it can be patterned through masking and plating to add additional material in order to build up a pattern to form the leadframe 532.

Figure 6:
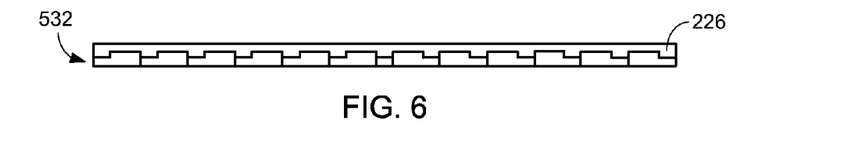
FIG. 6 is the structure of FIG. 5 in a coating phase of manufacture.

Referring now to FIG. 6, therein is shown the structure of FIG. 5 in a coating phase of manufacture. The leadframe 532 can be covered on a patterned side with the dielectric layer 226, such as solder mask. The dielectric layer 226 can be applied through a coating or lamination process, for example.

Figure 7:
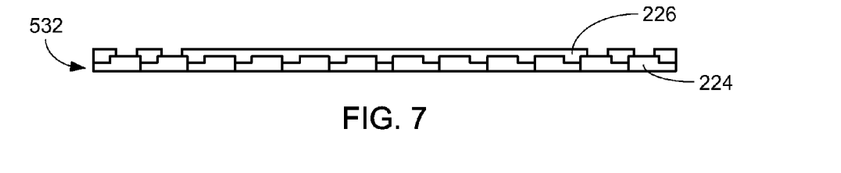
FIG. 7 is the structure of FIG. 6 in a coat patterning phase of manufacture.

Referring now to FIG. 7, therein is shown the structure of FIG. 6 in a coat patterning phase of manufacture. The dielectric layer 226 can then be patterned with an array of holes to expose part of the patterned side of the leadframe 532 by removing portions of the dielectric layer 226. The exposed portions of the leadframe 532 can be in a pattern that corresponds to some of the interposer contacts 224, such that each hole in the dielectric layer exposes only a single one of the interposer contacts 224.

Figure 8:
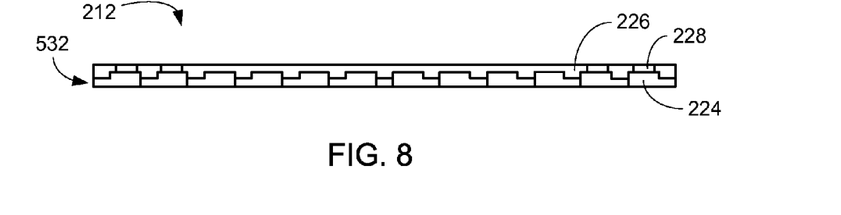
FIG. 8 is the structure of FIG. 7 in a connector formation phase of manufacture.

Referring now to FIG. 8, therein is shown the structure of FIG. 7 in a connector formation phase of manufacture. An array of the conductive posts 228 can be formed by filling in the holes in the dielectric layer 226 with conductive materials such as solder or copper. For example, if using solder to form the conductive posts 228, the solder can be printed or deposited into the holes in the dielectric layer 226 on the interposer contacts 224 exposed from the dielectric layer 226 in the previous step. Also for example, if using copper or other metal to form the conductive posts 228, a plating process can be used. The conductive posts 228 are shown as level with the surface of the dielectric layer 226, but it is understood that the conductive posts 228 could be recessed or higher than the surface of the dielectric layer 226.

Before the deposition of the conductive posts 228 a plating layer (not shown) of a material such as nickel, gold, palladium, or a combination thereof can be deposited on the portion of the leadframe 532 exposed through the dielectric layer 226. This plating layer could act as an etch stop, diffusion barrier, or solder-wettable layer. The deposition of the conductive posts 228 forms the single metal layer interposer 212.

Figure 9A:
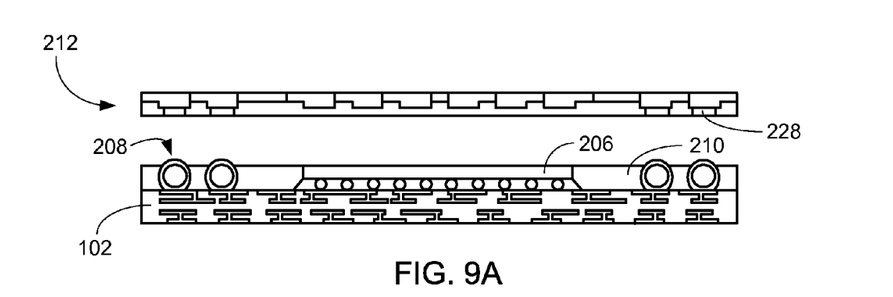
FIG. 9A is the structure of FIG. 8 in a mount preparation phase of manufacture.

Referring now to FIG. 9A, therein is shown the structure of FIG. 8 in a mount preparation phase of manufacture. The single metal layer interposer 212 is shown in a flipped orientation from FIG. 8, with the conductive posts 228 now on the bottom. The single metal layer interposer 212 is shown positioned above the integrated circuit die 206 mounted on the base substrate 102. The conductive posts 228 are each positioned over corresponding locations where the vertical interconnects 208 are exposed from the package body 210.

In this example, the vertical interconnects 208 extend above the top surface of the package body 210. The top (non-active) side of the integrated circuit die 206 is shown as coplanar with the top surface of the package body 210.

Figure 9B:
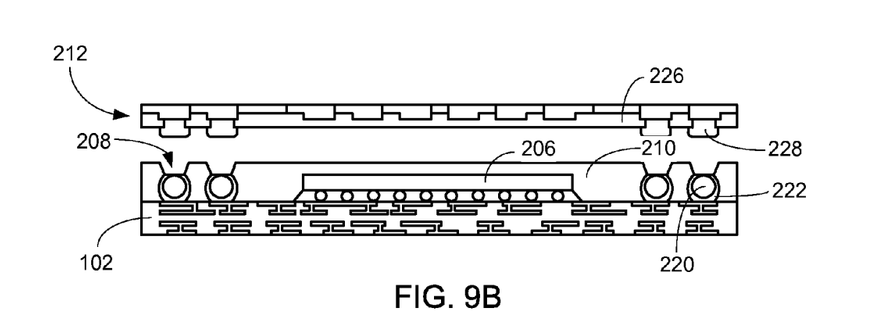
FIG. 9B is the structure of FIG. 8 in an alternate mount preparation phase of manufacture.

Referring now to FIG. 9B, therein is shown the structure of FIG. 8 in an alternate mount preparation phase of manufacture. The single metal layer interposer 212 is shown in a flipped orientation from FIG. 8, with the conductive posts 228 now on the bottom. Unlike FIG. 9A, the conductive posts 228 are not level or coplanar with the dielectric layer 226, but instead protrude from the dielectric layer 226, and have taken a mushroom shape due to the conductive posts 228 "overflowing" the holes in the dielectric layer 226. The single metal layer interposer 212 is shown positioned above the integrated circuit die 206 mounted on the base substrate 102. The conductive posts 228 are each positioned over corresponding locations where the vertical interconnects 208 are exposed from the package body 210.

In this example, the vertical interconnects 208 are recessed below the top surface of the package body 210. The openings in the dielectric layer 226 above the vertical interconnects 208 may have been formed through a process such as laser ablation, drilling, or a mask and etch process, for example. The integrated circuit die 206 is shown as having even the non-active surface encapsulated by the package body 210. The vertical interconnects 208 are shown as the conductive core 220 surrounded by the solder layer 222, but it is understood that the vertical interconnects 208 can be made of other materials and structures without any other changes. For example, the vertical interconnects 208 can be solder balls, conductive columns or posts, or other conductive structures.

Figure 10:
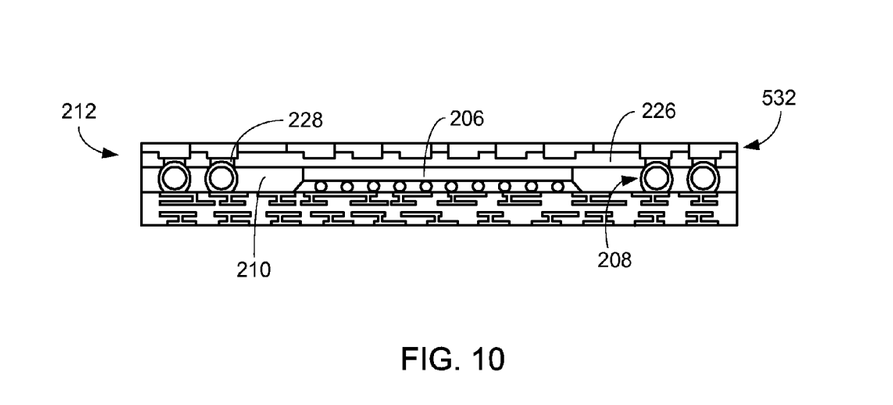
FIG. 10 is the structure of FIG. 9A in an interposer mounting phase of manufacture.

Referring now to FIG. 10, therein is shown the structure of FIG. 9A in an interposer mounting phase of manufacture. Through a process such as thermo-compression bonding (TCB) or mass reflow, the leadframe 532, the dielectric layer 226, and the conductive posts 228 are bonded to the top of the package body 210, the integrated circuit die 206, and the vertical interconnects 208. The bond can be between the vertical interconnects 208 and the conductive posts 228. During TCB or mass reflow, a top jig or other rigid structure placed on the single metal layer interposer 212 can help prevent warpage of the single metal layer interposer 212 as heat and/or pressure is applied.

Non-conductive film or non-conductive paste (NCF/NCP) material (not shown) can also be applied to the package body and the top of the integrated circuit die 206 to better adhere the two structures together, but it is understood that this extra adhesive is not necessary for proper bonding of the vertical interconnects 208 and the conductive posts 228.

It has been discovered that bonding the single metal layer interposer 212 to the vertical interconnects 208 after the application of the package body 210 increases efficiency and simplifies manufacturing. Attaching the single metal layer interposer 212 after molding the package body 210 avoids the issue of mold resin bleed-out, which is a problem that occurs if the package body 210 must be injected between an interposer and substrate. Further, application of the package body 210 before attaching the single metal layer interposer 212 can allow for higher throughput when molding the package body 210 due to not having to worry about the strength of the bond between the vertical interconnects 208 and the single metal layer interposer 212.

Figure 11:
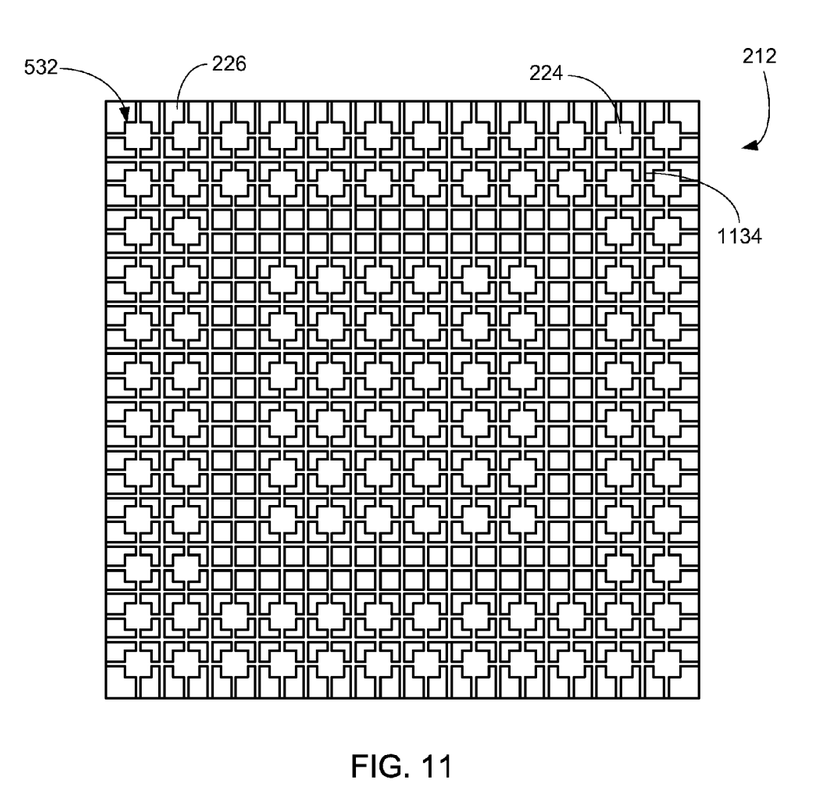
FIG. 11 is a top view of the structure of FIG. 10 in a manufacturing step of the integrated circuit packaging system of FIG. 2.

Referring now to FIG. 11, therein is shown top view of the structure of FIG. 10 in a manufacturing step of the integrated circuit packaging system 100 of FIG. 2. This top view shows the leadframe 532 embedded in the dielectric layer 226 of the single metal layer interposer 212 with a pattern generated by the process detailed in FIG. 5. In this example, the interposer contacts 224 and traces 1134 for routing signals can be seen interconnected for flexibility in routing.

It has been discovered that patterning the leadframe 532 in a regular pattern simplifies manufacturing along with lowering cost of manufacture. Because the initial patterning to form the leadframe 532 is a regular pattern for any application, costly customization of etch masks becomes unnecessary. Furthermore, because each of the interposer contacts 224 is potentially connected to any other of the interposer contacts 224, simple and easily customizable isolation processes such as laser ablation can be used to customize the routing for a particular application.

Figure 12:
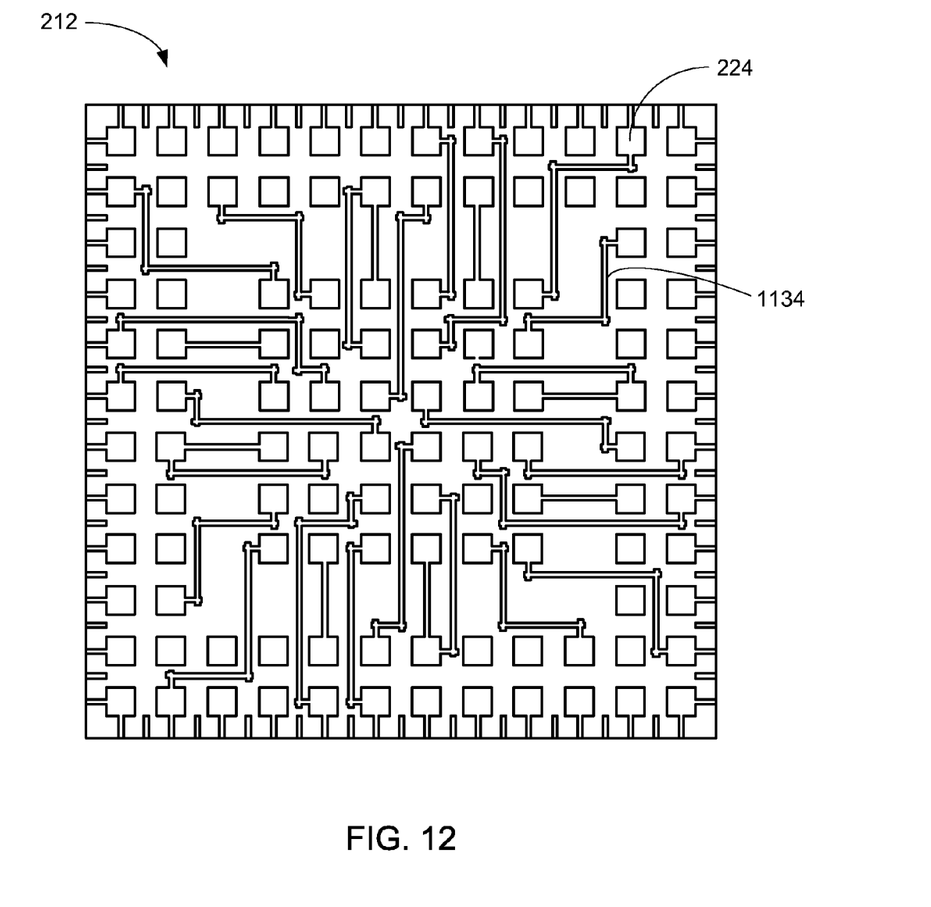
FIG. 12 is the structure of FIG. 11 in a laser ablation phase of manufacture.

Referring now to FIG. 12, therein is shown the structure of FIG. 11 in a laser ablation phase of manufacture. The laser ablation process can be used pattern the leadframe 532 of FIG. 5 further to isolate each of the interposer contacts 224 of the single metal layer interposer 212 and set the routing pattern, which determines how signals are routed between the interposer contacts 224 through the traces 1134. In this top view, the laser cuts in the dielectric layer 226 are not shown, but the resulting routing pattern having the interposer contacts 224 and the traces 1134 is. It is understood by one of ordinary skill in the art that the top view shown is for example only, and there are other possibilities. For example, a smaller number of cuts could be made to simply sever unwanted connections rather than removing all unwanted material.

Clearly seen in this top view is the arrangement of the interposer contacts 224, which are shown patterned in a central area and the periphery of the single metal layer interposer 212. It is understood that other configurations or patterns are possible. For example, the distance between each of the interposer contacts 224 could be adjusted to allow for enough routing possibilities such that the interposer contacts 224 could be arranged in a full array rather than in two groupings. Also for example, four groups of the interposer contacts 224 could be arranged in the four corners for greater connection and routing possibilities. Following a singulation step if necessary, the integrated circuit packaging system 100 if FIG. 2 is complete.

While the manufacturing step is described as occurring after mounting the single metal layer interposer 212, it is understood that the laser ablation step could be performed before mounting the single metal layer interposer 212 on the vertical interconnects 208 of FIG. 2, for example.

Figure 13:
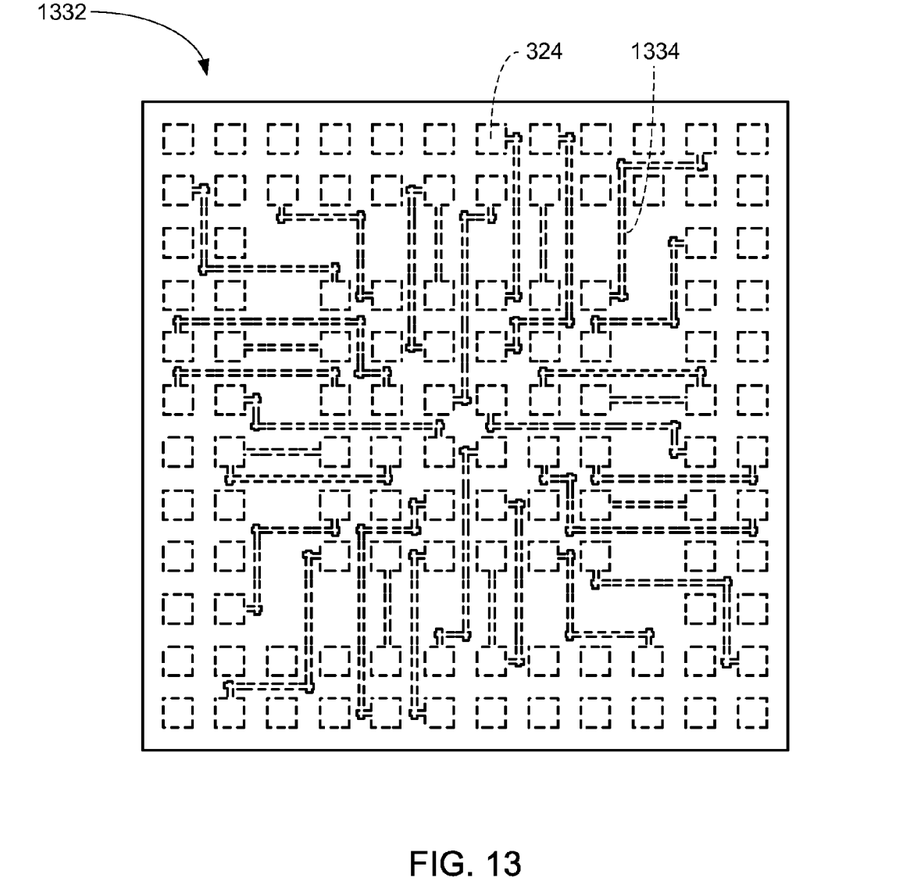
FIG. 13 is a top view of the structure of FIG. 10 in a manufacturing step of the integrated circuit packaging system of FIG. 3.

Referring now to FIG. 13, therein is shown a top view of the structure of FIG. 10 in a manufacturing step of the integrated circuit packaging system 300 of FIG. 3. The manufacturing steps for forming the embodiment shown in FIG. 3 are the same as those for forming FIG. 2, with the exception of the initial patterning of a leadframe 1332 and the isolation of the interposer contacts 324. The initial patterning of the leadframe 1332 can be seen in this top view with the routing pattern of the interposer contacts 324 already set, but with the interposer contacts 324 all connected through a thicker "plate" integral with traces 1334 and the interposer contacts 324. The interposer contacts 324 are shown with dotted lines to show that the exposed surface of the leadframe 1332 is a planar surface and the features are normally not visible in the top view.

Figure 14:
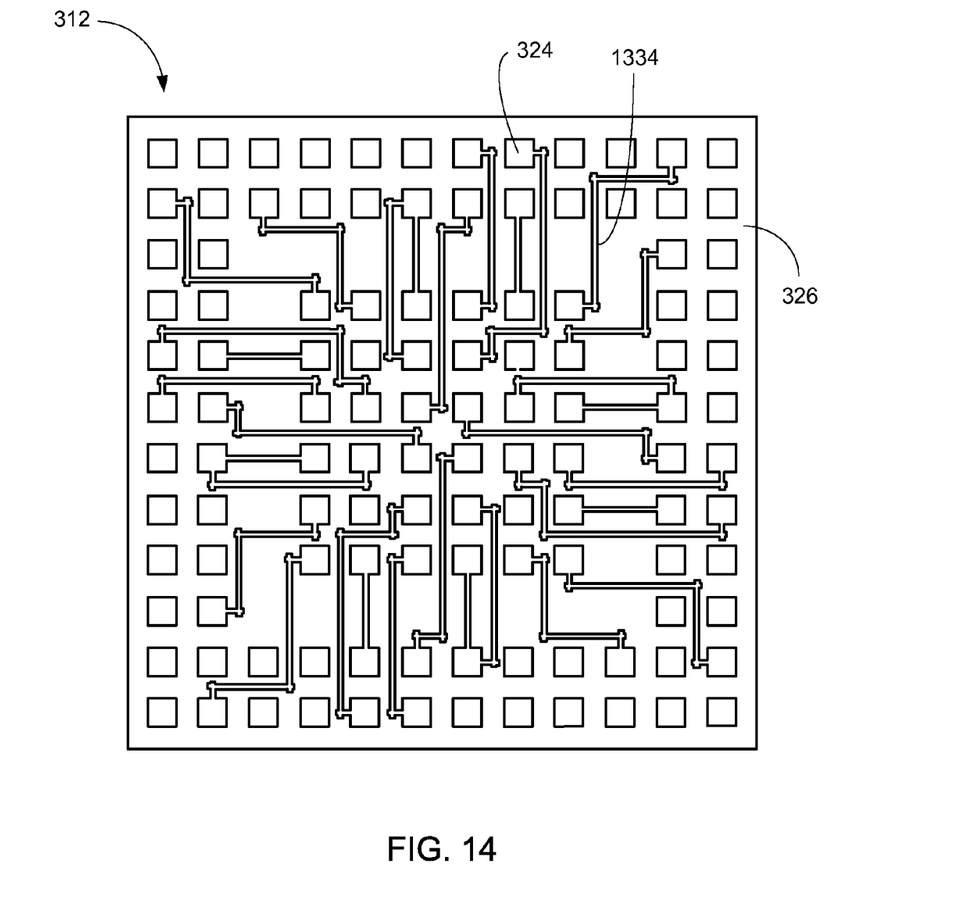
FIG. 14 is the structure of FIG. 13 in a chemical etch phase of manufacture.

Referring now to FIG. 14, therein is shown the structure of FIG. 13 in a chemical etch phase of manufacture. A chemical etch can be performed to etch away the "plate" portion of the leadframe 1332 of FIG. 13 to leave only the interposer contacts 324 and the traces 1334 embedded in the dielectric layer 326 with the pre-patterned routing pattern now usable. Unlike the structure shown in FIG. 12, there will not be any cuts in the dielectric layer 326, and any gap between the interposer contacts 324 will be filled with the dielectric layer 326. Both laser ablation and chemical etching will serve to form a desired routing pattern.

Further, while the manufacturing step is described as occurring after mounting the single metal layer interposer 312, it is understood that the chemical etching step could be performed before mounting the single metal layer interposer 312 on the vertical interconnects 308 of FIG. 3, for example.

Figure 15:
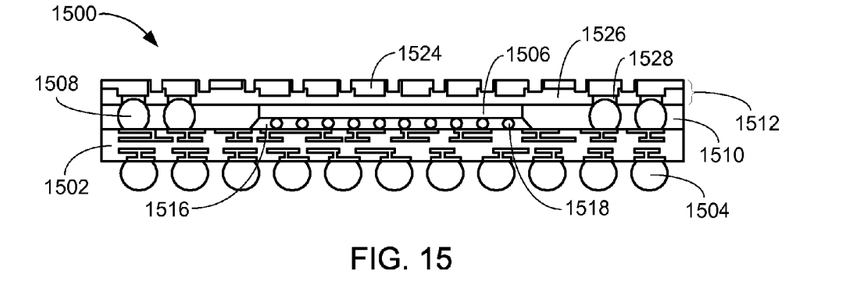
FIG. 15 is a cross-sectional view of the integrated circuit packaging system as exemplified by the top view of FIG. 1 and along the section line 2-2 of FIG. 1 in a third embodiment of the present invention.

Referring now to FIG. 15, therein is shown a cross-sectional view of the integrated circuit packaging system 1500 as exemplified by the top view of FIG. 1 and along the section line 2-2 of FIG. 1 in a third embodiment of the present invention. The cross-sectional view shows an integrated circuit die 1506, vertical interconnects 1508, a package body 1510, a single metal layer interposer 1512, and a base substrate 1502.

The base substrate 1502 is defined as a structure containing conductive traces and contacts. For example, the base substrate 1502 can be a laminate material, a metallic material, a ceramic material, or a combination thereof. The base substrate 1502 can have the external connectors 1504 on contact pads for connection to other components or next level systems.

The external connectors 1504, such as solder balls, can function to electrically connect components internal to the integrated circuit packaging system 1500 to the outside. The external connectors 1504 can be arranged in an array as shown or can be arranged in a staggered, regular, or irregular array, for example. The external connectors 1504 can also provide a path to ground.

The integrated circuit die 1506, such as a flip chip or a wire-bond die, can be mounted on the base substrate 1502 opposite the external connectors 1504. In this example, an underfill 1516 is between the integrated circuit die 1506 and the base substrate 1502, and the underfill 1516 surrounds internal interconnects 1518 which connect the integrated circuit die 1506 to the base substrate 1502.

Surrounding the integrated circuit die 1506 are vertical interconnects 1508 which are also on the base substrate 1502. The vertical interconnects 1508 can take various forms. In this example, the vertical interconnects 1508 are solder balls. The top of the vertical interconnects 1508 are exposed from the package body 1510, which encapsulates the integrated circuit die 1506 and the vertical interconnects 1508. The package body 1510 can be made from a material such as epoxy molding compound, curable underfill, or other moldable compound or encapsulation, for example.

The single metal layer interposer 1512 is defined as a structure having only a single metal layer of contacts and traces held together by a dielectric. The single metal layer interposer 1512 has interposer contacts 1524 exposed on one side of a dielectric layer 1526. A top surface of the interposer contacts 1524 can be coplanar with a top surface of the dielectric layer 1526 such that the interposer contacts 1524 are embedded in but exposed from the dielectric layer 1526. The interposer contacts 1524 are arranged in an array which includes the center area of the single metal layer interposer 1512 above the integrated circuit die 1506. In this example, the interposer contacts 1524 are isolated from each other by laser ablation, which leaves characteristic marks on the interposer contacts 1524 and the dielectric layer 1526 such as scorch marks, melted portions, and smooth side edges. The interposer contacts 1524 are separated from each other by a gap that is only partially filled by the dielectric layer 1526 due to the laser ablation process.

Some of the interposer contacts 1524 can be connected to the opposite side of the dielectric layer 1526 through conductive posts 1528. The conductive posts 1528 can be made from a conductive material such as solder, copper, or other plated or printed metal, for example. In this example, the conductive posts 1528 are solder or solder paste deposited through holes in the dielectric layer 1526 in direct contact with some of the interposer contacts 1524.

The conductive posts 1528 of the single metal layer interposer 1512 are in direct contact with the vertical interconnects 1508. This means that other components or packages connected to the interposer contacts 1524 can be connected to the external connectors 1504 through the single metal layer interposer 1512, the vertical interconnects 1508, and the base substrate 1502.

Figure 16:
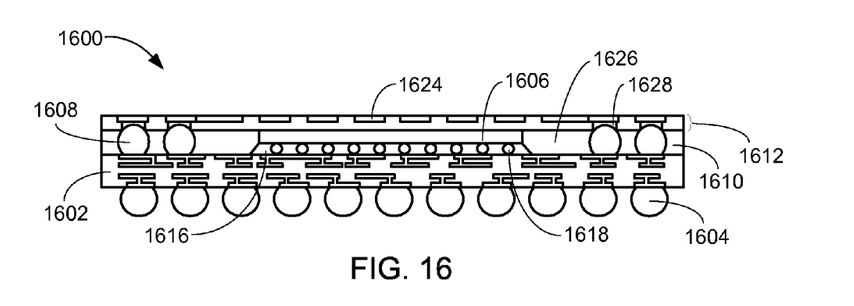
FIG. 16 is a cross-sectional view of the integrated circuit packaging system as exemplified by the top view of FIG. 1 and along the section line 2-2 of FIG. 1 in a fourth embodiment of the present invention.

Referring now to FIG. 16, therein is shown a cross-sectional view of the integrated circuit packaging system 1600 as exemplified by the top view of FIG. 1 and along the section line 2-2 of FIG. 1 in a fourth embodiment of the present invention. The cross-sectional view shows an integrated circuit die 1606, vertical interconnects 1608, a package body 1610, a single metal layer interposer 1612, and a base substrate 1602.

The base substrate 1602 is defined as a structure containing conductive traces and contacts. For example, the base substrate 1602 can be a laminate material, a metallic material, a ceramic material, or a combination thereof. The base substrate 1602 can have external connectors 1604 on contact pads for connection to other components or next level systems.

The external connectors 1604, such as solder balls, can function to electrically connect components internal to the integrated circuit packaging system 1600 to the outside. The external connectors 1604 can be arranged in an array as shown or can be arranged in a staggered, regular, or irregular array, for example. The external connectors 1604 can also provide a path to ground.

The integrated circuit die 1606, such as a flip chip or a wire-bond die, can be mounted on the base substrate 1602 opposite the external connectors 1604. In this example, an underfill 1616 is between the integrated circuit die 1606 and the base substrate 1602, and the underfill 1616 surrounds internal interconnects 1618 which connect the integrated circuit die 1606 to the base substrate 1602.

Surrounding the integrated circuit die 1606 are vertical interconnects 1608 which are also on the base substrate 1602. The vertical interconnects 1608 can take various forms. In this example, the vertical interconnects 1608 are solder balls. The top of the vertical interconnects 1608 are exposed from the package body 1610, which encapsulates the integrated circuit die 1606 and the vertical interconnects 1608. The package body 1610 can be made from a material such as epoxy molding compound, curable underfill, or other moldable compound or encapsulation, for example.

The single metal layer interposer 1612 is defined as a structure having only a single metal layer of contacts and traces held together by a dielectric. The single metal layer interposer 1612 has interposer contacts 1624 exposed on one side of a dielectric layer 1626. A top surface of the interposer contacts 1624 can be coplanar with a top surface of the dielectric layer 1626 such that the interposer contacts 1624 are embedded in but exposed from the dielectric layer 1626. The interposer contacts 1624 are arranged in an array which includes the center area of the single metal layer interposer 1612 above the integrated circuit die 1606. In this example, the interposer contacts 1624 are isolated from each other by chemical etching, which leaves characteristic marks on the interposer contacts 1624 and the dielectric layer 1626 such as the interposer contacts 1624 being slightly raised or recessed, excess material on the top surface of the dielectric layer 1626, or an uneven or rough surface of the dielectric layer 1626 due to damage from the etchant. The interposer contacts 1624 are separated from each other by a gap filled by the dielectric layer 1626.

Some of the interposer contacts 1624 can be connected to the opposite side of the dielectric layer 1626 through conductive posts 1628. The conductive posts 1628 can be made from a conductive material such as solder, copper, or other plated or printed metal, for example. In this example, the conductive posts 1628 are solder or solder paste deposited through holes in the dielectric layer 1626 in direct contact with some of the interposer contacts 1624.

The conductive posts 1628 of the single metal layer interposer 1612 are in direct contact with the vertical interconnects 1608. This means that other components or packages connected to the interposer contacts 1624 can be connected to the external connectors 1604 through the single metal layer interposer 1612, the vertical interconnects 1608, and the base substrate 1602.

Figure 17:
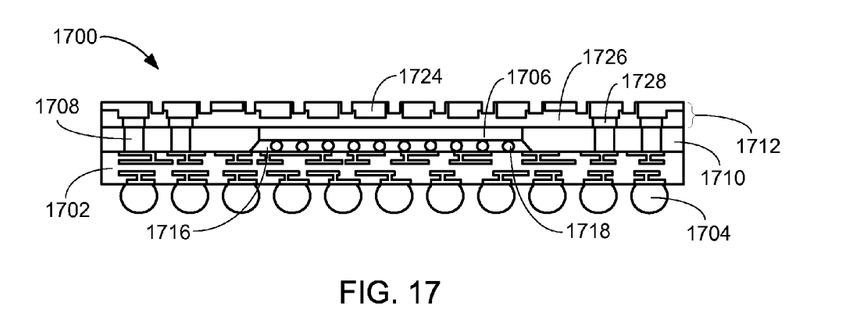
FIG. 17 is a cross-sectional view of the integrated circuit packaging system as exemplified by the top view of FIG. 1 and along the section line 2-2 of FIG. 1 in a fifth embodiment of the present invention.

Referring now to FIG. 17, therein is shown a cross-sectional view of the integrated circuit packaging system 1700 as exemplified by the top view of FIG. 1 and along the section line 2-2 of FIG. 1 in a fifth embodiment of the present invention. The cross-sectional view shows an integrated circuit die 1706, vertical interconnects 1708, a package body 1710, a single metal layer interposer 1712, and a base substrate 1702.

The base substrate 1702 is defined as a structure containing conductive traces and contacts. For example, the base substrate 1702 can be a laminate material, a metallic material, a ceramic material, or a combination thereof. The base substrate 1702 can have the external connectors 1704 on contact pads for connection to other components or next level systems.

The external connectors 1704, such as solder balls, can function to electrically connect components internal to the integrated circuit packaging system 1700 to the outside. The external connectors 1704 can be arranged in an array as shown or can be arranged in a staggered, regular, or irregular array, for example. The external connectors 1704 can also provide a path to ground.

The integrated circuit die 1706, such as a flip chip or a wire-bond die, can be mounted on the base substrate 1702 opposite the external connectors 1704. In this example, an underfill 1716 is between the integrated circuit die 1706 and the base substrate 1702, and the underfill 1716 surrounds internal interconnects 1718 which connect the integrated circuit die 1706 to the base substrate 1702.

Surrounding the integrated circuit die 1706 are vertical interconnects 1708 which are also on the base substrate 1702. The vertical interconnects 1708 can take various forms. In this example, the vertical interconnects 1708 are conductive columns made from a metal such as copper or an alloy thereof. The top of the vertical interconnects 1708 are exposed from the package body 1710, which encapsulates the integrated circuit die 1706 and the vertical interconnects 1708. The package body 1710 can be made from a material such as epoxy molding compound, curable underfill, or other moldable compound or encapsulation, for example.

The single metal layer interposer 1712 is defined as a structure having only a single metal layer of contacts and traces held together by a dielectric. The single metal layer interposer 1712 has interposer contacts 1724 exposed on one side of a dielectric layer 1726. A top surface of the interposer contacts 1724 can be coplanar with a top surface of the dielectric layer 1726 such that the interposer contacts 1724 are embedded in but exposed from the dielectric layer 1726. The interposer contacts 1724 are arranged in an array which includes the center area of the single metal layer interposer 1712 above the integrated circuit die 1706. In this example, the interposer contacts 1724 are isolated from each other by laser ablation, which leaves characteristic marks on the interposer contacts 1724 and the dielectric layer 1726 such as scorch marks, melted portions, and smooth side edges. The interposer contacts 1724 are separated from each other by a gap that is only partially filled by the dielectric layer 1726 due to the laser ablation process.

Some of the interposer contacts 1724 can be connected to the opposite side of the dielectric layer 1726 through conductive posts 1728. The conductive posts 1728 can be made from a conductive material such as solder, copper, or other plated or printed metal, for example. In this example, the conductive posts 1728 are solder or solder paste deposited through holes in the dielectric layer 1726 in direct contact with some of the interposer contacts 1724. The vertical interconnects 1708 can be coated or plated with a solder-wettable layer in order to increase adhesion between the conductive posts 1728 and the vertical interconnects 1708.

The conductive posts 1728 of the single metal layer interposer 1712 are in direct contact with the vertical interconnects 1708. This means that other components or packages connected to the interposer contacts 1724 can be connected to the external connectors 1704 through the single metal layer interposer 1712, the vertical interconnects 1708, and the base substrate 1702.

Figure 18:
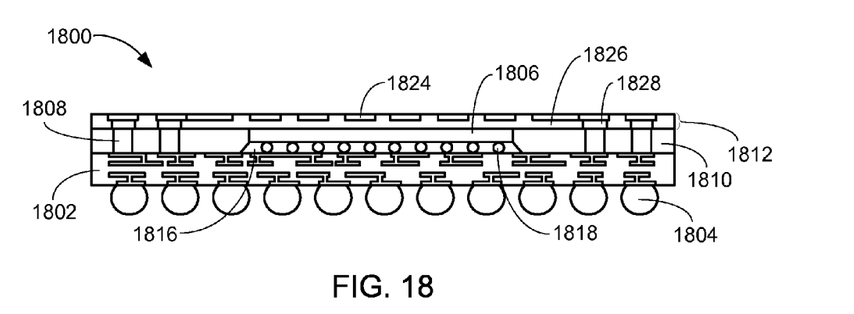
FIG. 18 is a cross-sectional view of the integrated circuit packaging system as exemplified by the top view of FIG. 1 and along the section line 2-2 of FIG. 1 in a sixth embodiment of the present invention.

Referring now to FIG. 18, therein is shown a cross-sectional view of the integrated circuit packaging system 1800 as exemplified by the top view of FIG. 1 and along the section line 2-2 of FIG. 1 in a sixth embodiment of the present invention. The cross-sectional view shows an integrated circuit die 1806, vertical interconnects 1808, a package body 1810, a single metal layer interposer 1812, and a base substrate 1802.

The base substrate 1802 is defined as a structure containing conductive traces and contacts. For example, the base substrate 1802 can be a laminate material, a metallic material, a ceramic material, or a combination thereof. The base substrate 1802 can have external connectors 1804 on contact pads for connection to other components or next level systems.

The external connectors 1804, such as solder balls, can function to electrically connect components internal to the integrated circuit packaging system 1800 to the outside. The external connectors 1804 can be arranged in an array as shown or can be arranged in a staggered, regular, or irregular array, for example. The external connectors 1804 can also provide a path to ground.

The integrated circuit die 1806, such as a flip chip or a wire-bond die, can be mounted on the base substrate 1802 opposite the external connectors 1804. In this example, an underfill 1816 is between the integrated circuit die 1806 and the base substrate 1802, and the underfill 1816 surrounds internal interconnects 1818 which connect the integrated circuit die 1806 to the base substrate 1802.

Surrounding the integrated circuit die 1806 are vertical interconnects 1808 which are also on the base substrate 1802. The vertical interconnects 1808 can take various forms. In this example, the vertical interconnects 1808 are conductive columns made from a metal such as copper or an alloy thereof. The top of the vertical interconnects 1808 are exposed from the package body 1810, which encapsulates the integrated circuit die 1806 and the vertical interconnects 1808. The package body 1810 can be made from a material such as epoxy molding compound, curable underfill, or other moldable compound or encapsulation, for example.

The single metal layer interposer 1812 is defined as a structure having only a single metal layer of contacts and traces held together by a dielectric. The single metal layer interposer 1812 has interposer contacts 1824 exposed on one side of a dielectric layer 1826. A top surface of the interposer contacts 1824 can be coplanar with a top surface of the dielectric layer 1826 such that the interposer contacts 1824 are embedded in but exposed from the dielectric layer 1826. The interposer contacts 1824 are arranged in an array which includes the center area of the single metal layer interposer 1812 above the integrated circuit die 1806. In this example, the interposer contacts 1824 are isolated from each other by chemical etching, which leaves characteristic marks on the interposer contacts 1824 and the dielectric layer 1826 such as the interposer contacts 1824 being slightly raised or recessed, excess material on the top surface of the dielectric layer 1826, or an uneven or rough surface of the dielectric layer 1826 due to damage from the etchant. The interposer contacts 1824 are separated from each other by a gap filled by the dielectric layer 1826.

Some of the interposer contacts 1824 can be connected to the opposite side of the dielectric layer 1826 through conductive posts 1828. The conductive posts 1828 can be made from a conductive material such as solder, copper, or other plated or printed metal, for example. In this example, the conductive posts 1828 are solder or solder paste deposited through holes in the dielectric layer 1826 in direct contact with some of the interposer contacts 1824. The vertical interconnects 1808 can be coated or plated with a solder-wettable layer in order to increase adhesion between the conductive posts 1828 and the vertical interconnects 1808.

The conductive posts 1828 of the single metal layer interposer 1812 are in direct contact with the vertical interconnects 1808. This means that other components or packages connected to the interposer contacts 1824 can be connected to the external connectors 1804 through the single metal layer interposer 1812, the vertical interconnects 1808, and the base substrate 1802.

Figure 19:
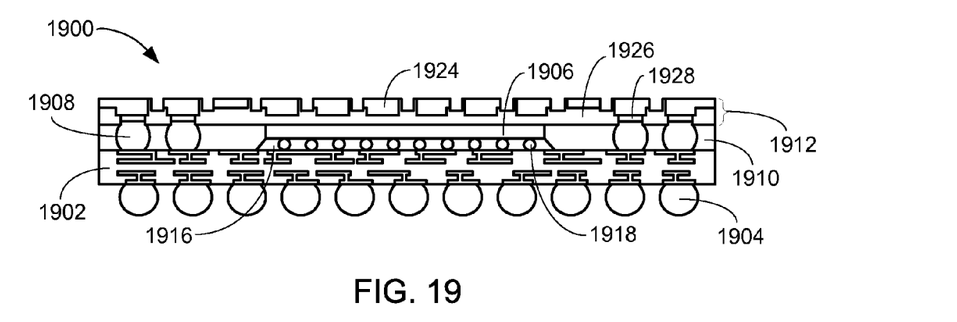
FIG. 19 is a cross-sectional view of the integrated circuit packaging system as exemplified by the top view of FIG. 1 and along the section line 2-2 of FIG. 1 in a seventh embodiment of the present invention.

Referring now to FIG. 19, therein is shown a cross-sectional view of the integrated circuit packaging system 1900 as exemplified by the top view of FIG. 1 and along the section line 2-2 of FIG. 1 in a seventh embodiment of the present invention. The cross-sectional view shows an integrated circuit die 1906, vertical interconnects 1908, a package body 1910, a single metal layer interposer 1912, and a base substrate 1902.

The base substrate 1902 is defined as a structure containing conductive traces and contacts. For example, the base substrate 1902 can be a laminate material, a metallic material, a ceramic material, or a combination thereof. The base substrate 1902 can have the external connectors 1904 on contact pads for connection to other components or next level systems.

The external connectors 1904, such as solder balls, can function to electrically connect components internal to the integrated circuit packaging system 1900 to the outside. The external connectors 1904 can be arranged in an array as shown or can be arranged in a staggered, regular, or irregular array, for example. The external connectors 1904 can also provide a path to ground.

The integrated circuit die 1906, such as a flip chip or a wire-bond die, can be mounted on the base substrate 1902 opposite the external connectors 1904. In this example, an underfill 1916 is between the integrated circuit die 1906 and the base substrate 1902, and the underfill 1916 surrounds internal interconnects 1918 which connect the integrated circuit die 1906 to the base substrate 1902.

Surrounding the integrated circuit die 1906 are vertical interconnects 1908 which are also on the base substrate 1902. The vertical interconnects 1908 can take various forms. In this example, the vertical interconnects 1908 are solder balls. The top of the vertical interconnects 1908 are exposed from the package body 1910, which encapsulates the integrated circuit die 1906 and the vertical interconnects 1908. The package body 1910 can be made from a material such as epoxy molding compound, curable underfill, or other moldable compound or encapsulation, for example.

The single metal layer interposer 1912 is defined as a structure having only a single metal layer of contacts and traces held together by a dielectric. The single metal layer interposer 1912 has interposer contacts 1924 exposed on one side of a dielectric layer 1926. A top surface of the interposer contacts 1924 can be coplanar with a top surface of the dielectric layer 1926 such that the interposer contacts 1924 are embedded in but exposed from the dielectric layer 1926. The interposer contacts 1924 are arranged in an array which includes the center area of the single metal layer interposer 1912 above the integrated circuit die 1906. In this example, the interposer contacts 1924 are isolated from each other by laser ablation, which leaves characteristic marks on the interposer contacts 1924 and the dielectric layer 1926 such as scorch marks, melted portions, and smooth side edges. The interposer contacts 1924 are separated from each other by a gap that is only partially filled by the dielectric layer 1926 due to the laser ablation process.

Some of the interposer contacts 1924 can be connected to the opposite side of the dielectric layer 1926 through conductive posts 1928. The conductive posts 1928 can be made from a conductive material such as solder, copper, or other plated or printed metal, for example. In this example, the conductive posts 1928 are made from copper deposited through holes in the dielectric layer 1926 in direct contact with some of the interposer contacts 1924. The conductive posts 1928 can be coated or plated with a solder-wettable layer in order to increase adhesion between the conductive posts 1928 and the vertical interconnects 1908. As can be seen, the conductive posts 1928 can be recessed into the dielectric layer 1926 and the vertical interconnects 1908 can extend into the dielectric layer 1926 as a result, which can improve the strength of the bond between the conductive posts 1928 and the dielectric layer 1926.

The conductive posts 1928 of the single metal layer interposer 1912 are in direct contact with the vertical interconnects 1908. This means that other components or packages connected to the interposer contacts 1924 can be connected to the external connectors 1904 through the single metal layer interposer 1912, the vertical interconnects 1908, and the base substrate 1902.

Figure 20:
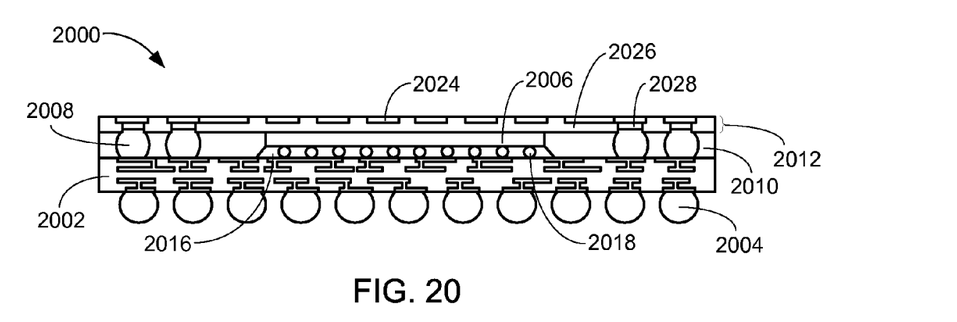
FIG. 20 is a cross-sectional view of the integrated circuit packaging system as exemplified by the top view of FIG. 1 and along the section line 2-2 of FIG. 1 in an eighth embodiment of the present invention.

Referring now to FIG. 20, therein is shown a cross-sectional view of the integrated circuit packaging system 2000 as exemplified by the top view of FIG. 1 and along the section line 2-2 of FIG. 1 in an eighth embodiment of the present invention. The cross-sectional view shows an integrated circuit die 2006, vertical interconnects 2008, a package body 2010, a single metal layer interposer 2012, and a base substrate 2002.

The base substrate 2002 is defined as a structure containing conductive traces and contacts. For example, the base substrate 2002 can be a laminate material, a metallic material, a ceramic material, or a combination thereof. The base substrate 2002 can have external connectors 2004 on contact pads for connection to other components or next level systems.

The external connectors 2004, such as solder balls, can function to electrically connect components internal to the integrated circuit packaging system 2000 to the outside. The external connectors 2004 can be arranged in an array as shown or can be arranged in a staggered, regular, or irregular array, for example. The external connectors 2004 can also provide a path to ground.

The integrated circuit die 2006, such as a flip chip or a wire-bond die, can be mounted on the base substrate 2002 opposite the external connectors 2004. In this example, an underfill 2016 is between the integrated circuit die 2006 and the base substrate 2002, and the underfill 2016 surrounds internal interconnects 2018 which connect the integrated circuit die 2006 to the base substrate 2002.

Surrounding the integrated circuit die 2006 are vertical interconnects 2008 which are also on the base substrate 2002. The vertical interconnects 2008 can take various forms. In this example, the vertical interconnects 2008 are solder balls. The top of the vertical interconnects 2008 are exposed from the package body 2010, which encapsulates the integrated circuit die 2006 and the vertical interconnects 2008. The package body 2010 can be made from a material such as epoxy molding compound, curable underfill, or other moldable compound or encapsulation, for example.

The single metal layer interposer 2012 is defined as a structure having only a single metal layer of contacts and traces held together by a dielectric. The single metal layer interposer 2012 has interposer contacts 2024 exposed on one side of a dielectric layer 2026. A top surface of the interposer contacts 2024 can be coplanar with a top surface of the dielectric layer 2026 such that the interposer contacts 2024 are embedded in but exposed from the dielectric layer 2026. The interposer contacts 2024 are arranged in an array which includes the center area of the single metal layer interposer 2012 above the integrated circuit die 2006. In this example, the interposer contacts 2024 are isolated from each other by chemical etching, which leaves characteristic marks on the interposer contacts 2024 and the dielectric layer 2026 such as the interposer contacts 2024 being slightly raised or recessed, excess material on the top surface of the dielectric layer 2026, or an uneven or rough surface of the dielectric layer 2026 due to damage from the etchant. The interposer contacts 2024 are separated from each other by a gap filled by the dielectric layer 2026.

Some of the interposer contacts 2024 can be connected to the opposite side of the dielectric layer 2026 through conductive posts 2028. The conductive posts 2028 can be made from a conductive material such as solder, copper, or other plated or printed metal, for example. In this example, the conductive posts 2028 are made from copper deposited through holes in the dielectric layer 2026 in direct contact with some of the interposer contacts 2024. The conductive posts 2028 can be coated or plated with a solder-wettable layer in order to increase adhesion between the conductive posts 2028 and the vertical interconnects 2008. As can be seen, the conductive posts 2028 can be recessed into the dielectric layer 2026 and the vertical interconnects 2008 can extend into the dielectric layer 2026 as a result, which can improve the strength of the bond between the conductive posts 2028 and the dielectric layer 2026.

The conductive posts 2028 of the single metal layer interposer 2012 are in direct contact with the vertical interconnects 2008. This means that other components or packages connected to the interposer contacts 2024 can be connected to the external connectors 2004 through the single metal layer interposer 2012, the vertical interconnects 2008, and the base substrate 2002.

Figure 21:
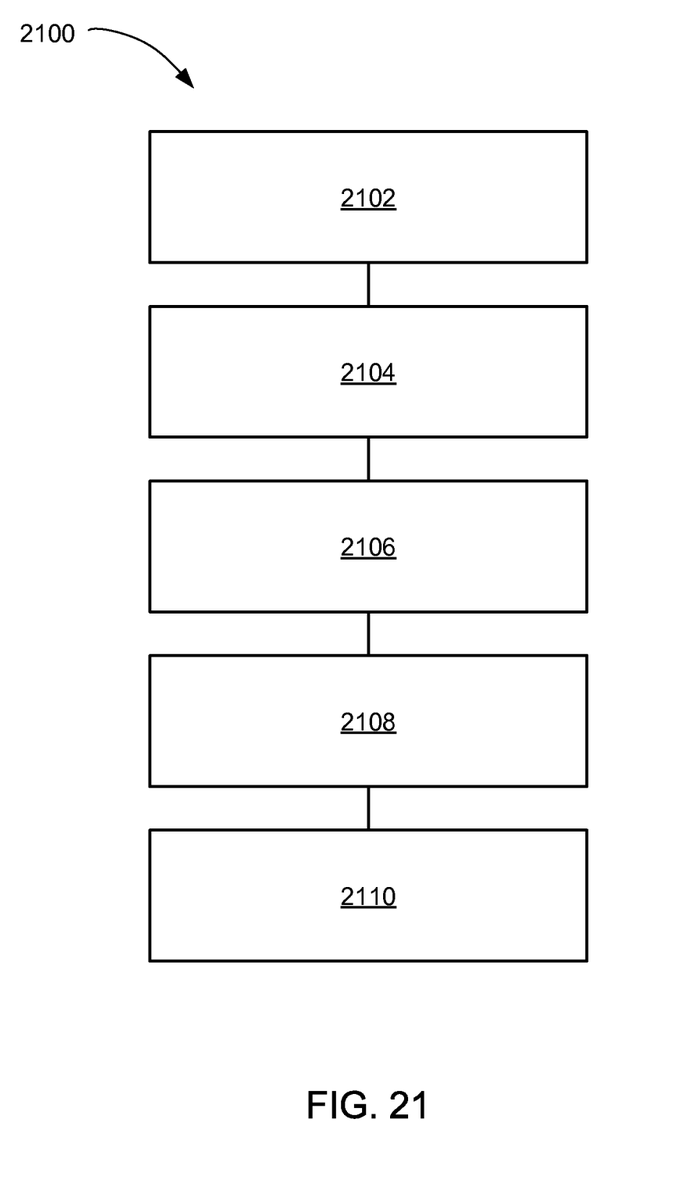
FIG. 21 is a flow chart of a method of manufacture of the integrated circuit packaging system in a further embodiment of the present invention.

Referring now to FIG. 21, therein is shown a flow chart of a method 2100 of manufacture of the integrated circuit packaging system 100 in a further embodiment of the present invention. The method 2100 includes: providing a base substrate in a block 2102; mounting an integrated circuit die on the base substrate in a block 2104; attaching vertical interconnects to the base substrate around the integrated circuit die in a block 2106; forming a single metal layer interposer including: providing a leadframe having interposer contacts, applying a dielectric layer to the leadframe, and removing a portion of the leadframe for forming a routing pattern with the interposer contacts and traces, a top surface of the interposer contacts coplanar with a top surface of the dielectric layer in a block 2108; and mounting the single metal layer interposer on the vertical interconnects in a block 2110.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a base substrate;
   mounting an integrated circuit die on the base substrate;
   attaching vertical interconnects to the base substrate around the integrated circuit die;
   forming a single metal layer interposer including:
      providing a leadframe having interposer contacts,
      applying a dielectric layer to the leadframe, and
      removing a portion of the leadframe for forming a routing pattern with the interposer contacts and traces, a top surface of the interposer contacts coplanar with a top surface of the dielectric layer; and
   mounting the single metal layer interposer on the vertical interconnects.

2. The method as claimed in claim 1 further comprising encapsulating the integrated circuit die and the vertical interconnects with a package body.

3. The method as claimed in claim 1 wherein mounting the single metal layer interposer on the vertical interconnects includes positioning the dielectric layer on the package body.

4. The method as claimed in claim 1 wherein forming the single metal layer interposer includes forming conductive posts through the dielectric layer.

5. The method as claimed in claim 1 further comprising attaching external connectors to the base substrate.

6. A method of manufacture of an integrated circuit packaging system comprising:
   providing a base substrate;
   mounting an integrated circuit die on the base substrate;
   attaching vertical interconnects to the base substrate around the integrated circuit die;
   encapsulating the integrated circuit die and the vertical interconnects with a package body;
   forming a single metal layer interposer including:
      providing a leadframe having interposer contacts,
      applying a dielectric layer to the leadframe,
      forming conductive posts through the dielectric layer, and
      removing a portion of the leadframe for forming a routing pattern with the interposer contacts and traces, a top surface of the interposer contacts coplanar with a top surface of the dielectric layer; and
   mounting the conductive posts of the single metal layer interposer on the vertical interconnects, the dielectric layer on the package body.

7. The method as claimed in claim 6 further comprising applying underfill between the base substrate and the integrated circuit die.

8. The method as claimed in claim 6 wherein attaching the vertical interconnects to the base substrate includes attaching solder balls to the base substrate.

9. The method as claimed in claim 6 wherein attaching the vertical interconnects to the base substrate includes attaching a conductive core surrounded by a solder layer to the base substrate.

10. The method as claimed in claim 6 wherein forming conductive posts through the dielectric layer includes:
    forming holes in the dielectric layer for exposing some of the interposer contacts; and
    depositing solder in the holes in the dielectric layer and on the interposer contacts.

11. An integrated circuit packaging system comprising:
    a base substrate;
    an integrated circuit die on the base substrate;
    vertical interconnects attached to the base substrate around the integrated circuit die; and
    a single metal layer interposer mounted on the vertical interconnects, the single metal layer interposer including:
       a routing pattern having interposer contacts and traces, and
       a dielectric layer on the interposer contacts and traces, a top surface of the interposer contacts coplanar with a top surface of the dielectric layer.

12. The system as claimed in claim 11 further comprising a package body encapsulating the integrated circuit die and the vertical interconnects.

13. The system as claimed in claim 11 wherein the dielectric layer is on the package body.

14. The system as claimed in claim 11 further comprising conductive posts formed through the dielectric layer.

15. The system as claimed in claim 11 further comprising external connectors attached to the base substrate.

16. The system as claimed in claim 11 further comprising:
    a package body encapsulating the integrated circuit die and the vertical interconnects;
    conductive posts formed through the dielectric layer;
    wherein:
       the dielectric layer is on the package body.

17. The system as claimed in claim 16 further comprising underfill between the base substrate and the integrated circuit die.

18. The system as claimed in claim 16 wherein the vertical interconnects are solder balls.

19. The system as claimed in claim 16 wherein the vertical interconnects are a conductive core surrounded by a solder layer.

20. The system as claimed in claim 16 wherein the conductive posts are formed from solder.

* * * * *